United States Patent [19]

Tsai

[11] Patent Number: 4,835,709

[45] Date of Patent: May 30, 1989

[54] ASSEMBLY MODELING PROCESS

[75] Inventor: Yukun Tsai, Middletown, N.J.

[73] Assignee: Bell Communications Research, Inc., Livingston, N.J.

[21] Appl. No.: 125,554

[22] Filed: Nov. 25, 1987

[51] Int. Cl.[4] .................... G06F 15/18; G06F 15/40
[52] U.S. Cl. .................................. 364/513; 364/200; 364/300; 364/900
[58] Field of Search ................ 364/513, 200, 900, 300

[56] References Cited

U.S. PATENT DOCUMENTS

| 4,468,732 | 8/1984 | Raver | 364/200 |
| 4,479,196 | 10/1984 | Ferrer et al. | 364/900 |
| 4,536,837 | 8/1985 | Olson et al. | 364/200 |
| 4,613,946 | 9/1986 | Forman | 364/518 |
| 4,658,370 | 4/1987 | Erman et al. | 364/300 |

Primary Examiner—Jerry Smith
Assistant Examiner—Paul Gordon
Attorney, Agent, or Firm—James W. Falk; John T. Peoples

[57] ABSTRACT

A method is disclosed for the operation of a computer process to generate and store a file representative of physical assemblies by utilizing an enhanced decision tree defining in detail the interrelationsips of subassemblies. The computer process further derives assembly operations from inputed component and subassembly operations.

5 Claims, 22 Drawing Sheets

FIG. 4

| ID | EQUIPMENT NAME | TREE | I/O | PARAM | COSTS |
|----|----------------|------|-----|-------|-------|
|    |                |      |     |       |       |

TREE I/O PARAM COSTS EQ_NODE

FIG. 5

| ID | EQUIPMENT NAME | TREE | I/O | PARAM | COSTS |
|---|---|---|---|---|---|
| 0 | D4_BAY | U | U | U | U |

CREATE/EDIT
EQUIPMENT TABLE

TREE I/O PARAM COSTS EQ_NODE

*FIG. 7*

```
                    CREATE CHILD
      EQUIPMENT TREE          | ID | EQUIPMENT NAME |
                              | 0  | D4_BAY         |
            0

ENTER THE CHILD EQUIPMENT ID AND NAME
                ID = ____
                NAME = ____
            NUMBER OF CHILD EQ. PER PARENT EQ. = ____
                    WRITE         END
```

FIG. 11

| ID | EQUIPMENT NAME | TREE | I/O | PARAM | COSTS |
|----|----------------|------|-----|-------|-------|
| 0  | D4_BAY         | S    | U   | U     | U     |
| 2  | D4_BANK        | S    | U   | U     | U     |
| 3  | PSEUDO_D4_CU   | S    | U   | U     | U     |
| 4  | D4_TR          | S    | U   | U     | U     |
| 5  | PSEUDO_D4_LIU  | S    | U   | U     | U     |
| 6  | D4_CUM         | S    | U   | U     | U     |
| 7  | D4_CUS         | S    | U   | U     | U     |
| 8  | M2             | S    | U   | U     | U     |
| 9  | M3             | S    | U   | U     | U     |

CREATE/EDIT EQUIPMENT TABLE

TREE I/O PARAM COSTS EQ_NODE

FIG. 13

```
                    PARAMETERS

EQUIP. ID = ____
              LENGTH = ____
              HEIGHT = ____
              WIDTH = ____
              VOLTAGE (VOLTS) = ____
              POWER (WATTS) = ____
              FIRST AVAILABLE (YR) = ____
              OUT OF SERVICE (YR) = ____

WRITE                    END
```

FIG. 14

```
                        COSTS

EQUIP. ID = ____
              MATERIAL COST = ____
              ANNUAL M'TCE COST = ____
              COST OF REMOVAL = ____
              SALVAGE VALUE = ____
              INSTALLED COST = ____
              TAX LIFE (YRS) = ____

WRITE                        END
```

FIG. 15

| ID | EQUIPMENT NAME | TREE | I/O | PARAM | COSTS |
|---|---|---|---|---|---|
| 0 | D4_BAY | S | S | S | S |
| 2 | D4_BANK | S | U | U | U |
| 3 | PSEUDO_D4_CU | S | U | U | U |
| 4 | D4_TR | S | U | U | U |
| 5 | PSEUDO_D4_LIU | S | U | U | U |
| 6 | D4_CUM | S | U | U | U |
| 7 | D4_CUS | S | U | U | U |
| 8 | M2 | S | U | U | U |
| 9 | M3 | S | U | U | U |

CREATE/EDIT EQUIPMENT TABLE

TREE I/O PARAM COSTS EQ_NODE

FIG. 16

| ID | EQUIPMENT NAME | TREE | I/O | PARAM | COSTS |
|----|----------------|------|-----|-------|-------|
| 0  | D4_BAY         | S    | S   | S     | S     |
| 2  | D4_BANK        | S    | S   | S     | S     |
| 3  | PSEUDO_D4_CU   | S    | S   | S     | S     |
| 4  | D4_TR          | S    | S   | S     | S     |
| 5  | PSEUDO_D4_LIU  | S    | S   | S     | S     |
| 6  | D4_CUM         | S    | S   | S     | S     |
| 7  | D4_CUS         | S    | S   | S     | S     |
| 8  | M2             | S    | S   | S     | S     |
| 9  | M3             | S    | S   | S     | S     |

CREATE/EDIT EQUIPMENT TABLE

TREE I/O PARAM COSTS EQ_NODE

FIG. 18

MIXED BY SUBSHELF

EQUIPMENT PSEUDO_D4_CU

| ID | EQUIPMENT NAME |
|----|----------------|
| 3  | PSEUDO_D4_CU   |
| 6  | D4CUM          |
| 7  | D4CUS          |

```
       3
       :
      MBS
      :48
  ┌----┴----┐
  6         7
```

ENTER MAXIMUM NUMBER OF CHILD EQUIPMENTS
IN GROUPING: ____

WRITE          END

FIG. 19

| ID | EQUIPMENT NAME |
|----|----------------|
| 3  | PSEUDO_D4_CU   |
| 6  | D4CUM          |
| 7  | D4CUS          |
| 10 | D4CUT          |

LIMITED MIXED

ENTER THE MAXIMUM NUMBER OF CHILD EQUIPMENTS
TYPES: ____

WRITE

ASSEMBLY MODELING PROCESS

FIELD OF THE INVENTION

The invention relates generally to the modeling of assembly configurations on a computer. Specifically, it relates to a process of generating a computer file which represents the attributes and interrelationships of piece-part components of assemblies, employing an enhanced "and/or goal tree" Artificial Intelligence technique.

BACKGROUND OF THE INVENTION

Groups or configurations of equipment and other assemblies have been modeled on computers for various purposes. One purpose is to economically optimize the equipment component selections in order to minimize the total cost of the configuration. Another purpose is to determine when equipment components must be manufactured or purchased in order to assemble the configuration. Still another purpose is to display the final configuration such that floor space and power requirements can be analyzed and planned.

Configurations of equipment have historically been modeled on a computer by pre-programming the possible piece-part asemblies with their attributes and interelationships. This approach is useful as long as equipment interactions and component attributes remain unchanged. If new equipment types become available, or if the attributes or interrelationships of old equipments change, the comptuer software must be modified by a skilled programmer to allow for the changes to be modeled. This situation leads to a further difficulty. In a universe of situations, either the program must be modified for each situation, making the maintenance of the various program permutations a time-consuming, expensive chore, or the program must be expanded to include all of the various permutations desired by the various users, resulting in a cumbersome, difficult to maintain program.

A further difficulty with the present modeling techniques is the inability of the computer system to interact with the user, who is forced to think only in terms of the attributes that have been pre-selected by the computer programmer. Novel thinking by the user about alternative approaches to the equipment configuration is not directly realizable. The user has effectively been removed from the model design process, relegating that function to the programmer, who might not be in as good a position to see the advantages of alternative approaches, and cannot react quickly to changed circumstances.

A final difficutly with the present arrangement is the interaction between the vendors of equipment components and the modeling user. A standard modeling arrangement with standard components leads to the equipment vendors relying on the traditional approach to the ultimate equipment configuration, rather than trying to come up with new equipments and configurations to solve old problems in novel ways.

SUMMARY OF THE INVENTION

These and other difficulties are alleviated by my novel process of operating a comptuer system wherein the "and/or goal tree" from the Artificial Intelligence field is enhanced and adapted to model assemblies of equipment.

The present invention enhances the standard goal tree approach by expanding the branching capabilities to include various permutations of groupings of child nodes, and employing control mechanisms via the type of branch chosen to connect the parent node with a child node. By expanding the branching capabilities thusly, modeling flexibility is greatly enhanced, such that assemblies of virtually unlimited complexity can be modeled and analyzed.

This enhanced tree methodolgy allows the user to control the computer system to define new assembly components which interact in new ways, with uniquely defined parameters and node interrelationships.

Another aspect of the present invention relates to the modeling of processes via the enhanced tree. By modeling the input and output of selected components, the combined inputs and outputs of subassemblies and assemblies can be internally derived. In this way, internal consistencies of processes are also validated and maintained within the computer model.

These and other benefits will be apparent from the following description and preferred embodiment.

BRIEF DESCRIPTION OF THE DRAWING

FIG. 4 shows a blank CREATE/EDIT frame;
FIG. 5 depicts a partially completed CREATE/EDIT TREE frame;
FIG. 7 shows a CREATE CHILD frame;
FIG. 11 depicts a completed CREATE/EDIT frame;
FIG. 13 shows a PARAMETERS frame;
FIG. 14 shows a COSTS frame;
FIG. 15 depicts a CREATE/EDIT frame where node attributes are not fully defined;
FIG. 16 depicts a CREATE/EDIT frame where node attributes are fully defined;
FIG. 18 shows a MIXED BY SUBSHELF frame;
FIG. 19 shows a LIMITED MIXED frame.

DETAILED DESCRIPTION

Figure 1:
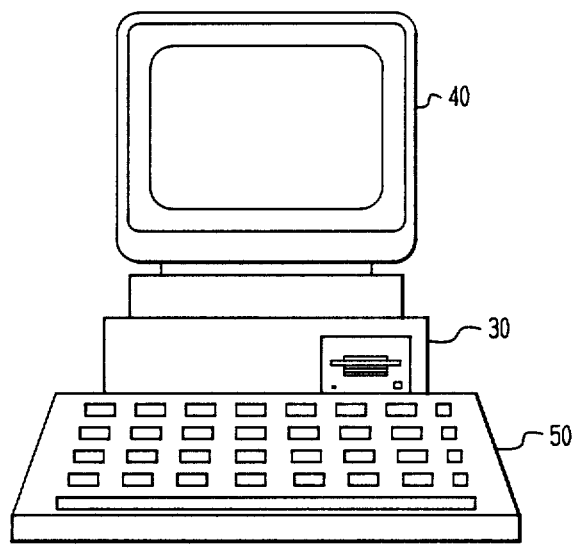
FIG. 1 depicts a general purpose computer.

In order to better understand the present invention, a description of the enhanced goal tree will be followed by a description of the enhanced process as applied to equipment modeling. Finally, a preferred embodiment of the present invention will demonstrate the workings and advantages of the instant inventive process.

A standard Artificial Intelligence goal tree, or decision tree, is made up of nodes and branches (see P. H. Winston, *Artificial Intelligence*, 2nd ed., Addison-Wesley, Reading, MA-1984). The first node is referred to as the "root" node, and subtending branches to other nodes, then the child nodes also act as "parent" nodes to their subtending child nodes, etc. Nodes with no subtending child nodes are known as "leaf" nodes.

A standard "and/or goal tree" has two types of branches. The parent node defines the type of branches connecting the parent node with the child nodes. Goal tree nodes represent goals, and an "and" nodes means that all of the child nodes, or goals, must be met before the parent node goal is met. If the parent node is an "or" node, then any one of the child node goals must be ralized before the parent node goal is met.

A standard and/or tree would not be practical to model an assembly of equipments, because the and/or choices of parent nodes would be inadequate to capture the complexitites of many equipment assembly permutations.

In order to enhance the standard goal tree to allow for the modeling of complex equipment assemblies, the present invention utilizes an expanded goal tree with, illustratively, six types of branching configurations. This enhanced process allows for the modeling of the attributes of the interrelationships of complex equipment assemblies. The configurations, along with a brief description of each in equipment terms, are listed below:

1. Tandem - This type node requires all of the child nodes in order to function properly, similar to the "and" node of the and/or goal tree.

2. Dedicated - This type node requires just one of the child nodes in order to function properly, similar to the "or" node of the and/or goal tree.

3. Growth - This type node defines in which order the child nodes must be placed as the assembly is augmented.

4. Mixed - This type node allows any permutation of child nodes.

5. Mixed by Subshelf - This type node defined separate groupings of child equipment, with a pre-defined number of equipments in each grouping.

6. Limited Mixed - This type node defines the maximum number of separate groupings of child equipment, but does not limit the number of equipments in each grouping.

In accordance with the present invention, the user can reflect the modularity of network equipment as well as structures which house the modular equipment. This capability is based upon modeling parent/child relationships where the parent equipment represents larger units (i.e., housings) and the child equipment represents smaller subunits that are placed in the housings. This relationship can be expanded via the present inventive process to result in a true structure where child equipment units, in turn, become the parent equipment units of smaller child equipment units. The resultant tree represents an equipment assembly.

In addition, the present invention models the operations performed by each individual equipment or subassembly, which results in the ability to derive the overall operations of the assembly. By specifying the inputs and outputs of subassemblies, the process compiles the input and output data into assembly input and output models, checks for internal consistency, and meets any requirements of downstream processing. The preset invention determines the operation of a general purpose computer as shown in FIG. 1, with user interaction illustratively occurring at keyboard 50, which actions are echoed on screen 40 while simultaneously transmitted to processor 30. Processor 30 then transmits updated information to the screen in order to direct the user on further inputing.

Processor 30 builds the equipment configuration in the form of an enhanced and/or tree by directing the user to specify the makeup and interrelationships of the various nodes and branches.

The following embodiment illustrates the present inventive process. It is not necessary to be familiar with the equipment assembly described below in order to undestand the invention. All that is required is to understand how the equipment assembly is modeled by utilizing the instant process with an enhanced and/or goal tree.

Figure 2:
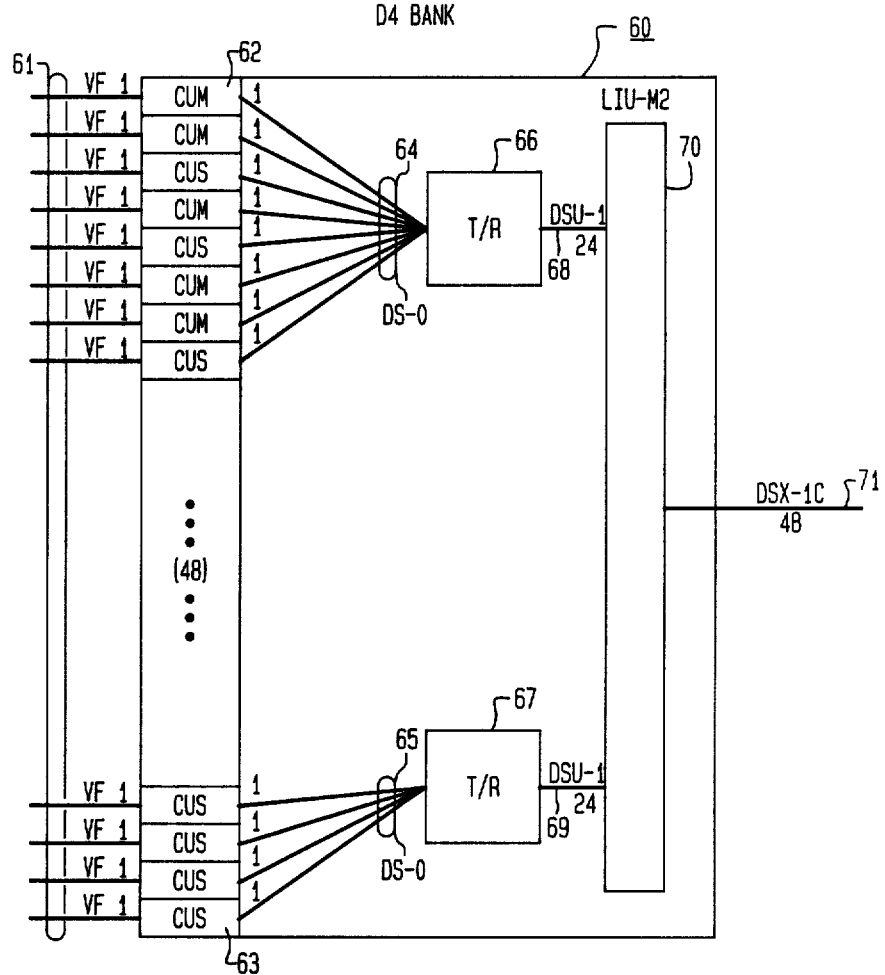
FIG. 2 depicts a D4 bank structure.

The equipment assembly modeled is a portion of a telecommunications transmission network known as a D4 Digital Terminal. Six D4 banks are housed in a D4 bay, which assembly constitutes a D4 Digital Terminal. FIG. 2 is a functional diagram of a D4 bank. The following cursory description of a D4 bank will aid in the subsequent description of the invention. Up to forty-eight voice frequency (VF) circuits 61 that originate in various customer locations terminate in D4 bank 60 at channel units (illustratively 62 and 63). If a circuit carries ordinary voice communications, a Message Channel Unit (CUM) is used, such as CUM 62. If a special type circuits terminates at D4 bank 60, then a Special Channel Unit (CUS) is employed, such as CUS 63. Channel units such as 62 and 63 can be placed in any combination, and convert the communications on circuit group 61 to digital pulses and transmit the pulses over circuit groups 64 and 65 to Transmitter/Receivers (T/R) 66 and 67. The digital pulses are referred to as DS-0 coding. Twenty-four of the channel units are connected to T/R 66 and twenty-four with T/R 67.

T/R 66 combines the twenty-four DS-0 signals on group 64 into one DSU-1 signal carried on circuit 68. The DSU-1 signal is a multiplexed digital bit stream of uni-polar pulses. T/R 67 performs the identical function on the twenty-four DS-0 signals on circuit group 65 and outputs a DSU-1 signal on circuit 69.

Line Interface Unit (LIU) 70, type M2, combines the two DSU-1 signals on circuits 68 and 69, converts the uni-polar pulses to bipolar, and transmits the combined signal on output line 71, which now carried all of the original forty-eight communications from group 61. An M3 type LIU could have been used in place of the M2 unit 70. The M3 would also convert from uni-polar to bipolar, but would output two DSX-1 lines, each carrying twenty-four channels of communications.

Figure 3:
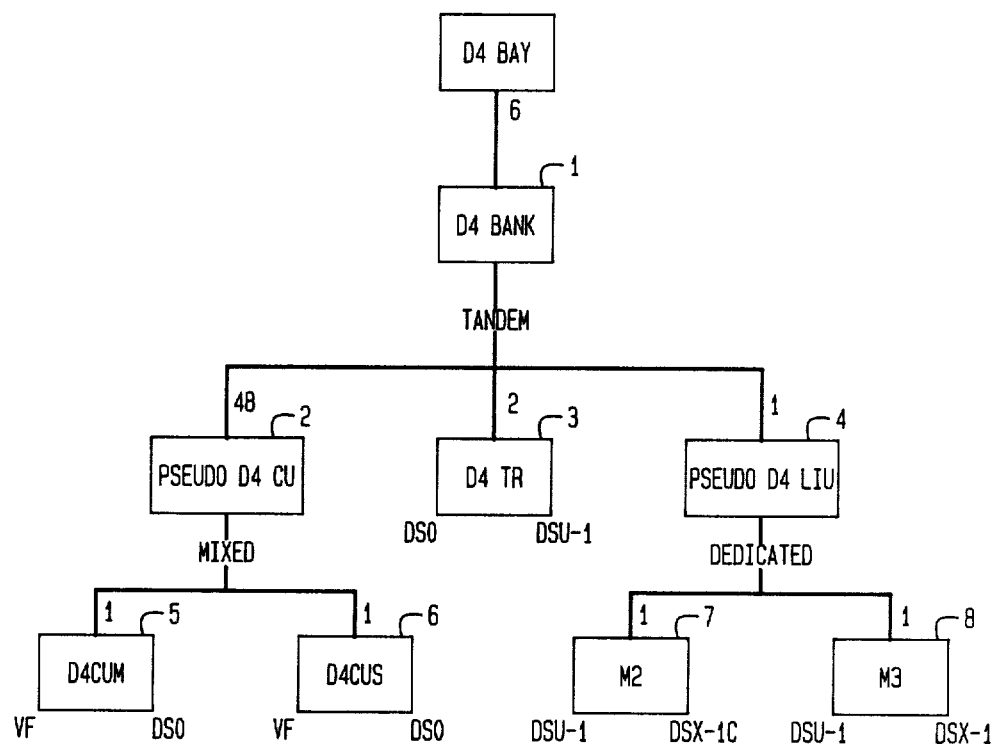
FIG. 3 depicts a tree diagram of an equipped D4 bay.

A diagram in tree form of the working D4 bay of FIG. 2 is shown in FIG. 3. The branching below D4 bank 1 is TANDEM because all three child nodes are required (D4 CU's, D4 TR's, and D4 LIU) in a working D4 bank. Pseudo D4 CU 2 is required to allow for a mixture of D4 CU's (D4CUM's 5 and D4CUS's 6). Because there are no constraints on the mixture, the MIXED branching control is chosen to subtend Pseudo D4 CU node 2. The DEDICATED branch control is used subtending Pseudo D4 LIU 4 because only one of the child nodes (M2 7 or M3 8) is allowed.

The input to D4 CU components is VF and the output is DS-0. The input to a D4 TR is DS-0 and the output is DSU-1. The input to an M2 or an M3 is DSU-1. The output of an M2 is DSX-1C, and the output of an M3 is DSX-1. These signals are depicted on the associated boxes of FIG. 3 with the input on the left of the associated box and the output on the right. From this model, it can be determined that the derived input to the D4 Band is VF, and the derived output is either DSC-1C or DSX-1, depending on which D4 LIU is installed (M2 or M3).

Figure 6:
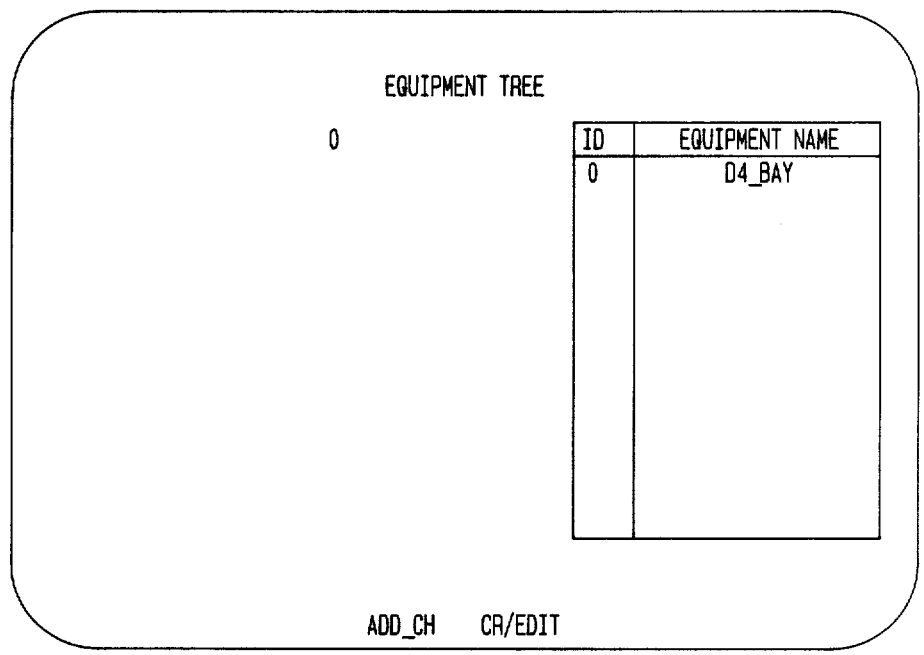
FIG. 6 shows a partially computed EQUIPMENT TREE FRAME.

In order to input the information of FIG. 3 into the computer, the instant inventive process may be utilized as follows:

The first frame displayed on the screen upon start-up of the enhanced modeling program is the CREATE/EDIT frame (FIG. 4), which displays an equipment table listing the defined pieces of equipment along with an indication as to the attributes or parameters or each piece of equipment that have been specified (to be discussed in more detail subsequently). The table is initially blank because no equipment has yet been defined. The bottom line lists the options (menu) available to the user at this stage of the process. The options may be illustratively invoked by typing the first letter of the option name on the computer keyboard (e.g., "T" for TREE). By invoking EQNODE, processor 30 will request, via the screen, the Equipment ID. The user arbitrarily specified "0". Processor 30 will next request the Equipment Name, whereupon the user will input D4BAY. The screen will then look like FIG. 5. The U's under the TREE, I/O, PARAM, and COSTS headings show that those attributes of the D4 bay have not yet been specified. The next selection made from the bottom of FIG. 5 is TREE, whereupon processor 30 will display FIG. 6 on the screen.

The zero near the center of the screen represents the ID of the root equipment. Subtending branches and child nodes will be added to the zero as the inputing process progresses. The table at the right of the screen shows that ID zero is a D4BAY. The menu at the bottom of the screen represents choices that the user can make to direct processor 30 for further modeling activities.

Figure 8:
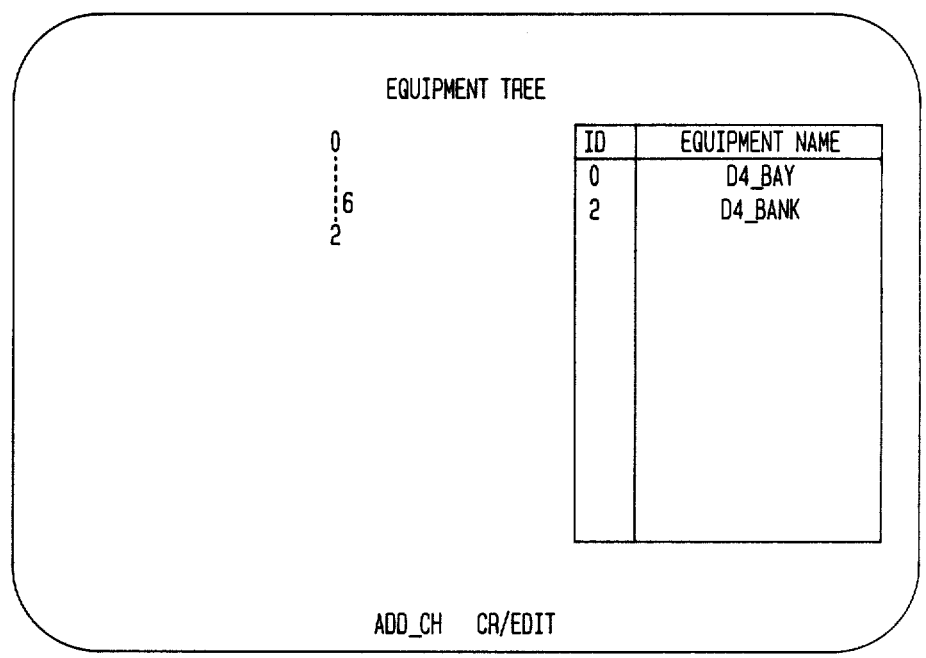
FIG. 8 shows a partially completed EQUIPMENT TREE frame.

By invoking ADDCH (Add Child) from the menu, processor 30 will then request the parent ID, which in this case is 0. Processor 30 then displays the CREATE CHILD EQUIPMENT frame (FIG. 7) and requests the ID and NAME of the first child equipment and the number of children allowed of that type. The user responds with "2" and "D4 BANK", and "6", respectively. By then specifying END from the menu, processor 30 determines that the branch control need not be specified, because only one child node was defined. Processor 30 then displays the updated EQUIPMENT TREE (FIG. 8). By again invoking ADDCH, processor 30 will request the parent ID, whereupon "2" is inputed by the user. The CREATE CHILD EQUIPMENT frame is again displayed, whereupon the user inputs the PSEUDO D4CU child. When WRITE is selected, processor 30 will blank out the entry lines so that another child node can be entered. After the second child node (D4TR) is inputed, the PSEUDOD4-LIU is similarly inputed as the third child node. Now when END is selected, processor 30 will display the BRANCH CONFIGURATION CONTROL frame (FIG. 9) on the screen, in order to determine how the three child nodes are to be installed.

Figure 10:
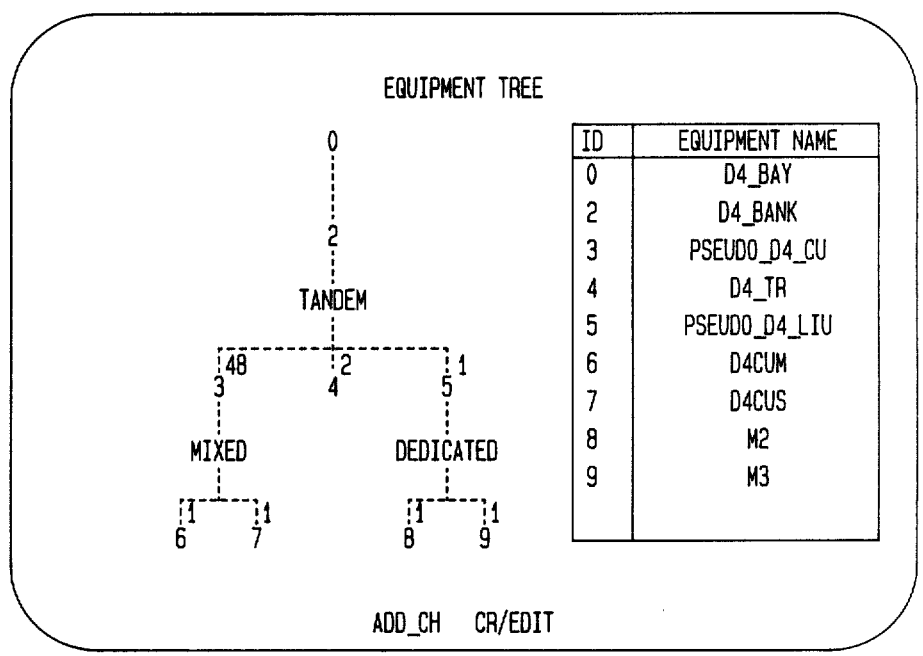
FIG. 10 depicts a completed EQUIPMENT TREE frame.

Since all three child equipments are needed for a working D4 bank, the TANDEM branch control is invoked by the user by inputing a "6" after the statement "ENTER THE BRANCH CONFIGURATION CONTROL". Processor 30 then returns to the EQUIPMENT TREE frame where the above process is continued until the entire equipment assembly of FIG. 3 has been inputed. After this is complete, the EQUIPMENT TREE frame appears as FIG. 10.

Figure 12:
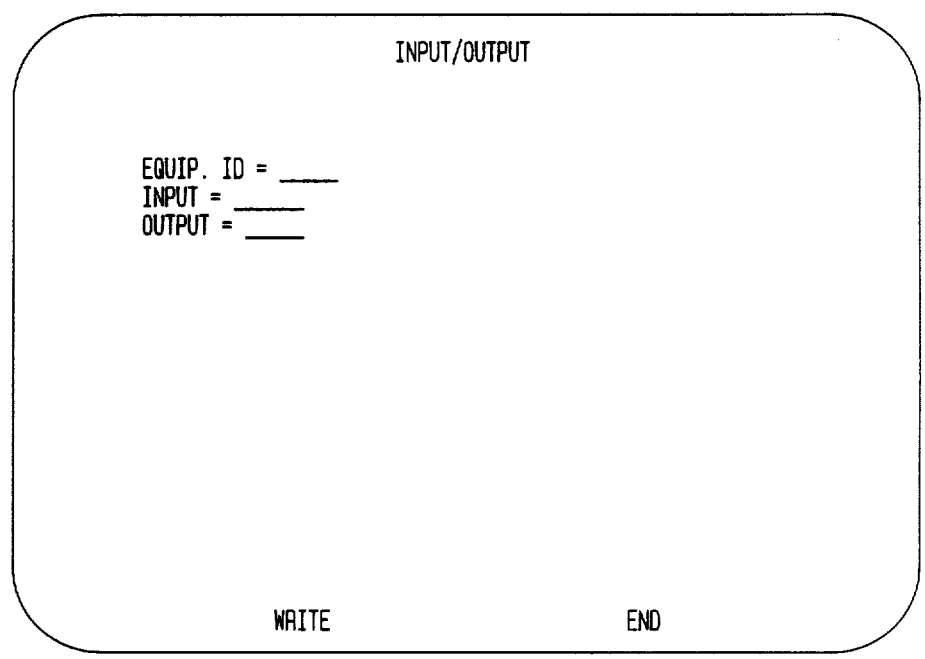
FIG. 12 shows an INPUT/OUTPUT frame.

Next, CREATE/EDIT is invoked by the user, which causes the CREATE/EDIT frame to be displayed (FIG. 11). By selecting I/O in this frame, processor 30 will display the INPUT/OUTPUT frame (FIG. 12). By specifying the known inputs and outputs (in this case there are none, as seen from FIG. 3), the input/output of the working D4 bay is modeled. When END is selected, processor 30 saves the inputs, converts from a "U" to an "S" in the I/O column for D4 bay on FIG. 11, and returns to the CREATE/EDIT frame. The user then invokes PARAM, whereupon processor 30 displays the PARAMETERS frame (FIG. 13). The questions displayed are answered by the user. By selecting END, processor 30 saves the inputs, converts from a "U" to an "S" in the PARAM column for D4 bay on FIG. 11, and returns to the CREATE/EDIT frame. The user similarly calls up the COSTS frame (FIG. 14). After the appropriate costs are inputed by the user, and END is selected, processor 30 returns to the CREATE/EDIT frame (FIG>15), which depicts the information inputed with an "S", and the missing data with a "U". By continuing this inputing process, the final CREATE/EDIT frame will be as shown in FIG. 16.

Figure 17:
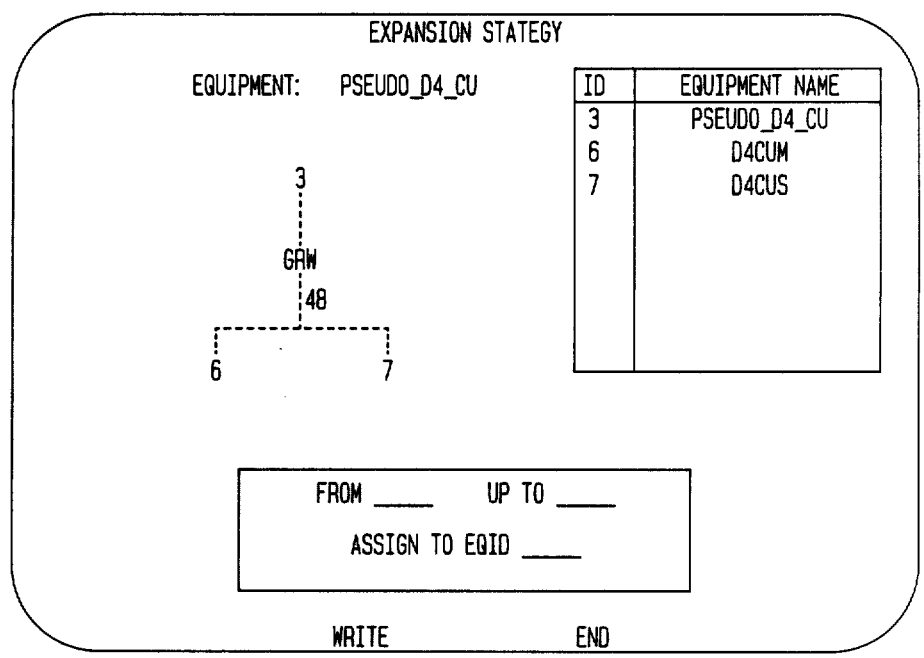
FIG. 17 depicts an EXPANSIOM STRATEGY frame.

If instead of the above example it was required that the first five D4 CU's be D4CUM's and the remaining ones be D4CUS's, then the appropriate branch control would be GROWTH. When this control is selected by the user from FIG.9, processor 30 will display the EXPANSION STRATEGY frame (FIG.17). The user would input "1", "5", and "6" after FROM, UP TO, and ASSIGN TO EQID, respectively. The user would next select WRITE, causing processor 30 to save those values and display FIG.17 again. The user would then input "6", "48", and "7" respectively to complete the growth scenario. The user would next select END, which would signal processor 30 to return to the EQUIPMENT TREE frame.

Figure 9:
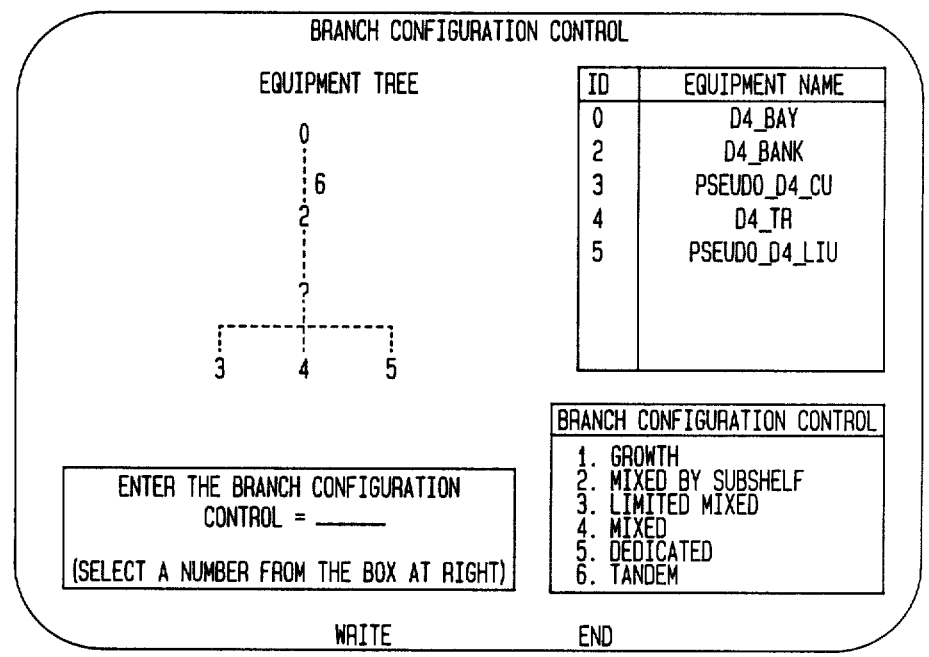
FIG. 9 shows a BRANCH CONFIGURATION CONTROL frame.

The last two branch controls on FIG. 9 to be discussed are MIXED BY SUBSHELF and LIMITED MIXED. If each D4 BAnk had two shelves to hold the 48 D4 CU's, the first shelf could hold 20, the second shelf could hold 28, but the two types of D4 CU/s (D4CUM and D4CUS) could not be mixed on any one shelf, then the following process would take place. The user selects MIXED BY SUBSHELF when choosing the branch configuration control (FIG. 9) of the pseudo D4 CU, whereupon processor 30 displays FIG. 18. The user inputs "20", then selects WRITE. Processor 30 then returns FIG. 18 to the display. The user next inputs "28" and selects WRITE. When FIG. 18 is next displayed, the user selects END, whereupon processor 30 displays the EQUIPMENT TREE frame.

The LIMITED MIXED branch control of FIG. 9 is employed if a parent equipment can only have a limited number of types of child equipments, but within that limitation, the types can be mixed in any manner. For example, if in addition to D4CUM's and D4CUS's, there was another type of D4 CU's called D4CUT's, but the D4 Bank could only accommodate up to two of the three types, then the user would select LIMITED MIXED as a branch control for the pseudo D4 CU node, whereupon processor 30 would display the LIMITED MIXED frame (FIG. 19). The user would input "2" and select WRITE, whereupon processor 30 would display the EQUIPMENT TREE frame.

Figure 20:
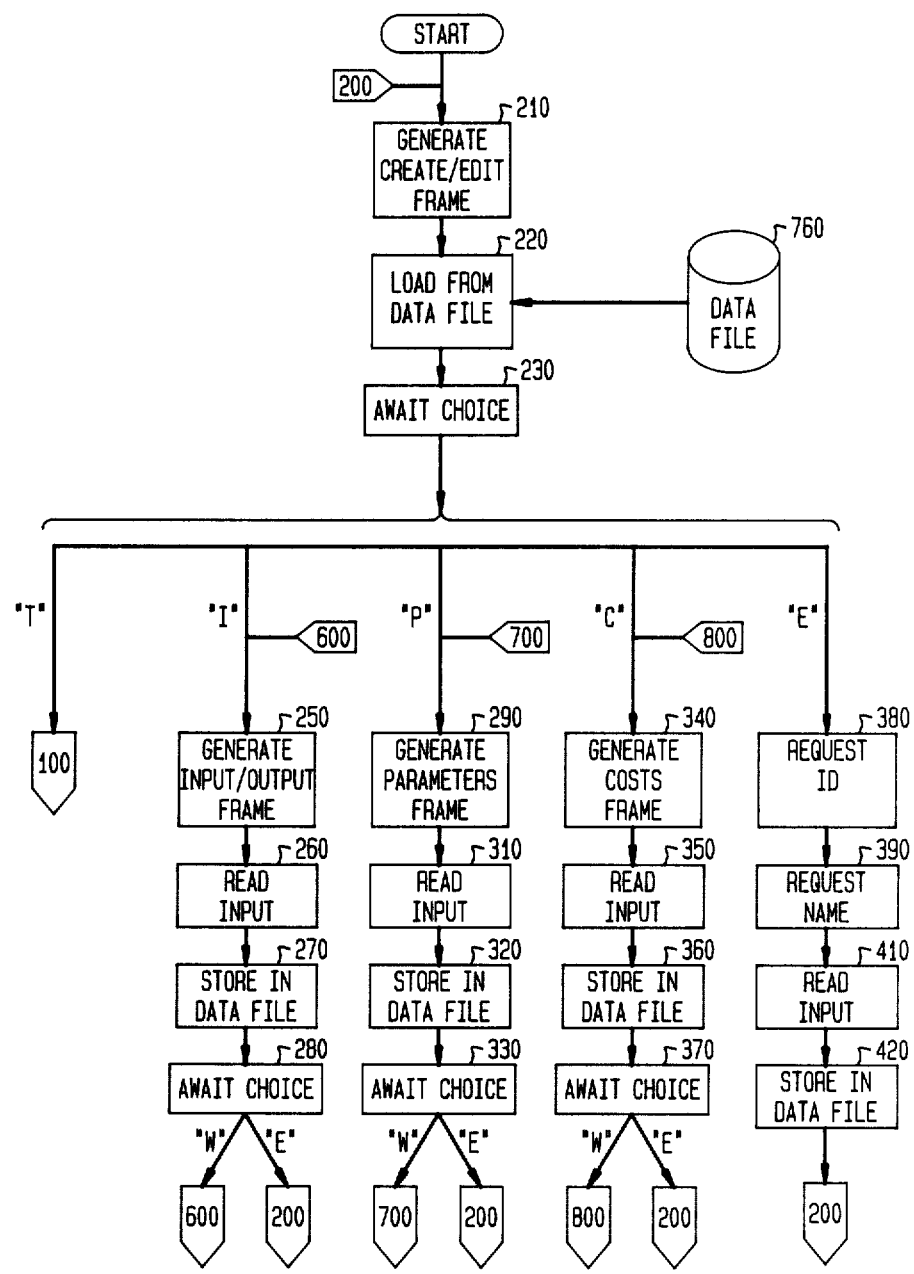
FIG. 20 is a flow diagram of the CREATE/EDIT frame process.
Figure 21:
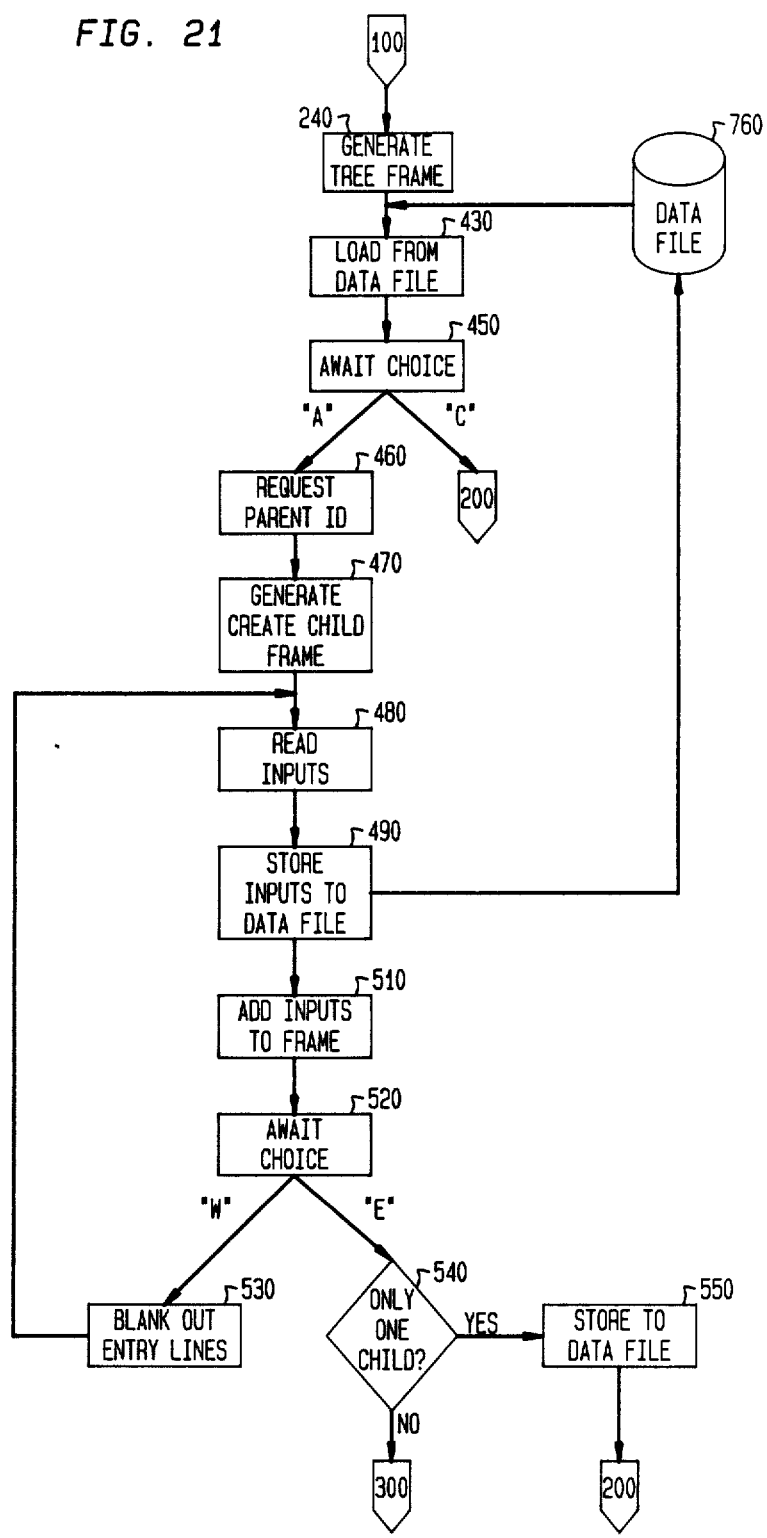
FIG. 21 is a flow diagram of the EQUIPMENT TREE frame process.
Figure 22:
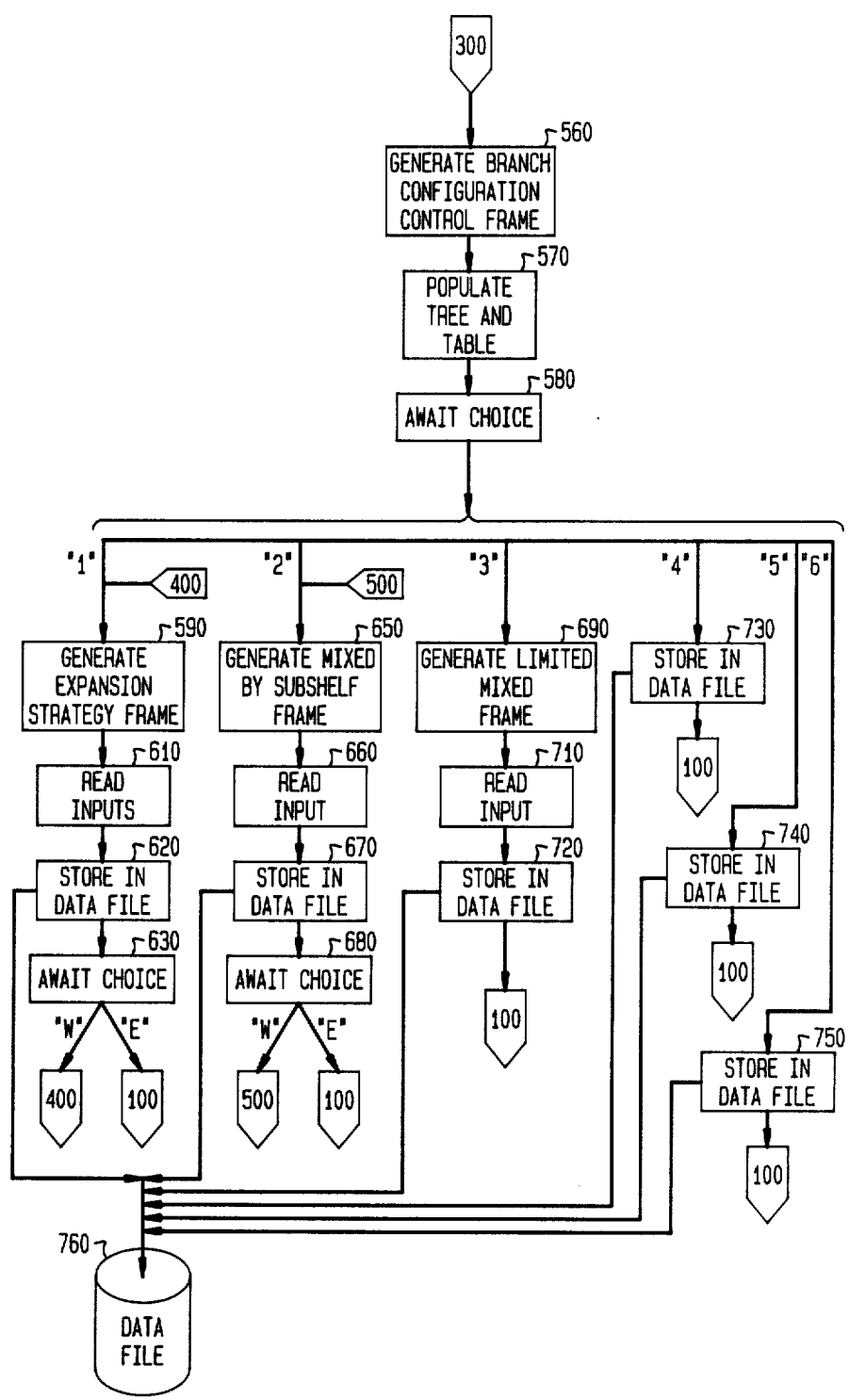
FIG. 22 is a flow diagram of the BRANCH CONFIGURATION CONTROL frame process.

The inventive process is depicted in flow diagrams in FIGS. 20-22. In FIG. 20, the first step 210 is the displaying of the CREATE/EDIT frame on the screen. Any equipment descriptions stored in Data File 760 are utilized in step 220 to populate the CREATE/EDIT frame. Step 230 is to accept user input.

If the user inputs a "T", the Equipment Tree frame is generated by step 240 on FIG. 21 (as discussed in detail above). If the user inputs an "I", then step 250 calls for the generation and display of the INPUT/OUTPUT frame. Subsequent step 260 is to read the user's inputs on the INPUT/OUTPUT frame, and step 270 is to store the inputed data in Data File 760. Step 280 is to await the next user choice. If "W" is inputed, processor 30 returns to step 250. If "E" is chosen, the processor returns to step 210.

If the user chooses "P" after step 230, then step 290 is accomplished by generating the PARAMETERS frame. The user's inputs to this frame are read in at step 310. Step 320 is to store the inputed data in Data File 760. Step 330 is to await the next user choice. If "W" is selected, processor 30 returns to step 290. If "E" is chosen, processor 30 returns to step 210.

If the user chooses "C" in response to the CREATE/EDIT frame, then step 340, generating the COSTS frame, is performed. Step 350 is to read the user's inputs to this frame, and step 360 is to store the inputs in Data File 760. Step 370 is to await the user's next selection. If "W" is chosen, then the COSTS frame is regenerated. If "E" is selected, the CREATE/EDIT frame is generated in step 210.

If the user selects "E" in response to the CREATE/EDIT frame, processor 30 will request the Equipment ID in step 380. The Equipment Name is requested in step 390, the ID and name are read in step 410, and are stored in Data File 760 in step 420. Processor 30 then would regenerate the CREATE/EDIT frame after step 420.

FIG. 21 portrays the process beginning with the generation of the Equipment Tree Frame. Thus far in the description, this is requested by the user inputing a "T" in response to the CREATE/EDIT frame. Step 430 loads the Equipment Tree Frame from Data File 760. Step 450 is to await the user selection. If "C" is selected, the CREATE/EDIT file is generated (step 210 of FIG. 20). If "A" is selected, step 460 requests the parent ID. Step 470 generates the CREATE CHILD frame with the selected parent node as the root node displayed. The user inputs are read in step 480 and stored back to Data File 760 in step 490. The inputs are added to the tree and data block of the CREATE CHILD frame in step 510. Step 520 is to await the next user selection. If "W" is selected, then step 530 blanks out the entry lines so that more inputs can be entered. If "E" is selected, processor 30 asks if there is only one child. If the answer is "YES", the inputs are stored in Data File 760 in step 550, and the CREATE/EDIT frame is displayed (step 210 of FIG. 20). If "NO" is selected, the process continues as depicted in FIG. 22, with the generation of the BRANCH CONFIGURATION CONTROL frame in step 560. Step 570 populates the tree and data block of the frame. Step 580 is to await the next user selection.

If "1" is selected, step 590 is to generate the EXPANSION STRATEGY frame. The inputs are read in step 610. Step 620 is to store the inuts in Data File 760. Step 630 is to await the user's next selection. If "W" is chosen, the EXPANSION STRATEGY frame is regenerated in step 590. If "E" is chosen, the EQUIPMENT TREE frame is displayed in step 240 of FIG. 21.

If the user selects "2" from the BRANCH CONFIGURATION CONTROL frame, step 650 generates the MIXED BY SUBSHELF frame. Step 660 reads the user's inputs to this frame, and step 670 stores the inputs in Data File 760. Step 680 accepts the user's next choice. If "W" is chosen, the MIXED BY SUBSHELF frame is regenerated by step 650. If "E" is selected, the EQUIPMENT TREE frame is displayed in step 240 of FIG. 21.

If the user selects "3" from the BRANCH CONFIGURATION CONTROL frame, step 690 generates the LIMITED MIXED frame. The user inputs are read by step 710 and stored in Data File 760 in step 720. Processor 30 then displays the EQUIPMENT TREE frame in step 240 of FIG. 21.

If the user selects "4", "5", or "6" from the BRANCH CONFIGURATION CONTROL frame, associated steps 730, 740, or 750 store the response in Data File 760 and display the EQUIPMENT TREE frame in step 240 of FIG. 21.

It should be clear to one ordinarily skilled in the art that sub-combinations of the six branch controls might be adequate for any given modeling situation. It should also be apparent that such situations as "working" and "standby" equipment configurations can be modeled by classifying the working units as one child node and the standby equipment as another, and the GROWTH branch control may be employed to define the ratio of working to standby units as units are added. Finally, it should be apparent that very simple or very complex equipment assemblies can be modeled using the enhanced tree and branch controls, as well as accommodating any change in the interrelationships of the pieceparts of the assembly.

The above embodiment is illustrative only, and variations would be obvious to one of ordinary skill in the art without departing from the scope of the invention.

What is claimed is:

1. A method for operating a computer system to generate and store a configuration file in an accessible memory of the system wherein the contents of the file are representative of a physical assembly expressed in terms of constituent subassemblies, said method comprising the steps of defining an enhanced decision tree corresponding to the assembly, said tree being composed of nodes, branches and branch control mechanisms and wherein each of the subassemblies corresponds to preselected ones of said nodes and said branches and an associated one of said branch control mechanisms, displaying a list of options wherein said options include fields for supplying information on the interconnection arrangement of said preselected ones of said nodes, branches and associated branch control mechanisms to configure each of the subassemblies and to specify its corresponding locations in said tree, and processing said information to produce a coded representation of the assembly.

2. The method of claim 1 wherein the step of processing further comprises parsing the associated fields to obtain said information, processing said information to produce said coded representation of a composite assembly composed of the combination of said each of the subassemblies, and then storing said coded representation in the memory, said stored representation being the configuration file.

3. The method of claim 2 wherein each said branch control mechanism comprises one of the following types:
(a) Growth;
(b) Mixed;
(c) Mixed by subshelf;
(d) Limited Mixed;
(e) Dedicated; and
(f) Tandem.

4. The method of claim 2 wherein predetermined ones of said nodes represent the input and output of asociated ones of subassemblies and components.

5. The method of claim 4 further comprising the step of deriving assembly input and output from said input and output of said associated ones of subassemblies and components.

* * * * *

UNITED STATES PATENT AND TRADEMARK OFFICE
CERTIFICATE OF CORRECTION

PATENT NO. : 4,835,709

DATED : May 30, 1989

INVENTOR(S) : Yukun Tsai

It is certified that error appears in the above-identified patent and that said Letters Patent is hereby corrected as shown below:

Column 3, line 2, after word branches insert --of the root node connect other nodes, known as "child" nodes. If the child nodes have subtending branches--.

Column 3, line 65, "preset" should read --present--.

Column 5, line 3, "Band" should read --Bank--.

Column 6, line 45, "CU/s" should read --CU's--.

Column 7, line 66, "inuts" should read --inputs--.

Signed and Sealed this

Thirteenth Day of October, 1992

Attest:

DOUGLAS B. COMER

*Attesting Officer*  *Acting Commissioner of Patents and Trademarks*